(12) United States Patent
Warner et al.

(10) Patent No.: US 8,816,886 B1
(45) Date of Patent: Aug. 26, 2014

(54) METHOD AND APPARATUS TO CONTROL THE EFFECTIVE GAIN OF A STATISTICALLY CALIBRATED ANALOG TO DIGITAL CONVERTER

(71) Applicant: PMC-Sierra US, Inc., Sunnyvale, CA (US)

(72) Inventors: William D. Warner, Maple Ridge (CA); Anthony Eugene Zortea, Pipersville, PA (US); Jim Guziak, Laurys Station, PA (US)

(73) Assignee: PMC-Sierra US, Inc., Sunnyvale, CA (US)

( * ) Notice: Subject to any disclaimer, the term of this patent is extended or adjusted under 35 U.S.C. 154(b) by 0 days.

(21) Appl. No.: 13/833,401

(22) Filed: Mar. 15, 2013

(51) Int. Cl.
*H03M 1/10* (2006.01)
*H03M 1/18* (2006.01)

(52) U.S. Cl.
CPC *H03M 1/10* (2013.01); *H03M 1/18* (2013.01); *H03M 1/181* (2013.01); *H03M 1/182* (2013.01)
USPC .......................... 341/120; 341/139; 341/155

(58) Field of Classification Search
USPC .......................................... 341/120, 139, 155
See application file for complete search history.

(56) References Cited

U.S. PATENT DOCUMENTS

| 5,389,927 | A  | * | 2/1995  | Turney et al. ................ 341/139 |
| 6,567,025 | B2 | * | 5/2003  | Schreier et al. .............. 341/143 |
| 6,603,416 | B2 | * | 8/2003  | Masenas et al. .............. 341/120 |
| 7,161,523 | B1 |   | 1/2007  | Zortea |
| 7,253,762 | B2 |   | 8/2007  | Huang et al. |
| 7,262,724 | B2 | * | 8/2007  | Hughes et al. ................ 341/139 |
| 7,541,952 | B1 |   | 6/2009  | Sankaran et al. |
| 7,557,741 | B2 | * | 7/2009  | Van Veldhoven ............ 341/139 |
| 7,825,837 | B1 |   | 11/2010 | Khasnis et al. |
| 7,839,313 | B2 |   | 11/2010 | Kidambi |

OTHER PUBLICATIONS

Huang et al., "A Statistical Background Calibration Technique for Flash Analog-to-Digital Converters", Circuits and Systems, ISCAS, IEEE International Symposium on Circuits and Systems, May 23-26, 2004, vol. 1, pp. 1-125 to 128, Hsin-Chu, Taiwan.
Agazzi et al., "Background Calibration of Interleaved Analog to Digital Converters for High-Speed communications Using Interleaved Timing Recovery Techniques", Circuits and Systems, ISCAS, IEEE International Symposium on Circuits and Systems, May 23-25, 2005, vol. 2, pp. 1390-1393, Irvine, California, USA.
Tsimbinos et al., "Improved error-table compensation of A/D converters" IEE Proc.-Circuits Devices Syst., vol. 144, No. 6, Dec. 1997.

* cited by examiner

*Primary Examiner* — Khai M Nguyen
(74) *Attorney, Agent, or Firm* — Dennis R. Haszko

(57) ABSTRACT

A method and apparatus for controlling the effective gain of an ADC when the ADC is occasionally or continuously calibrated using the statistics of the input signal and when the statistics are not stationary.

34 Claims, 17 Drawing Sheets

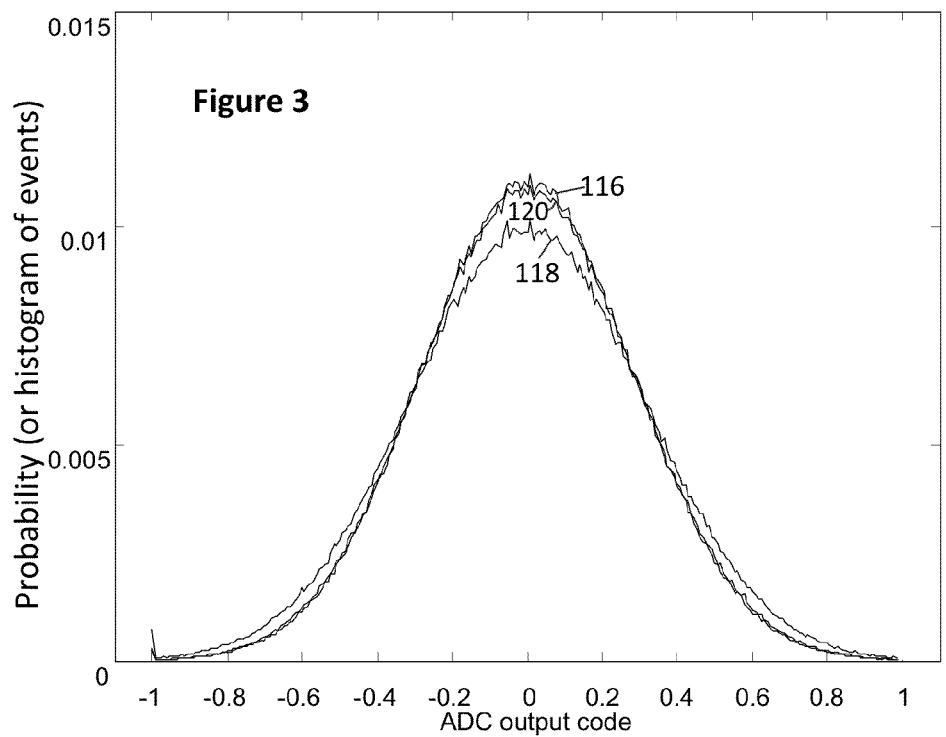
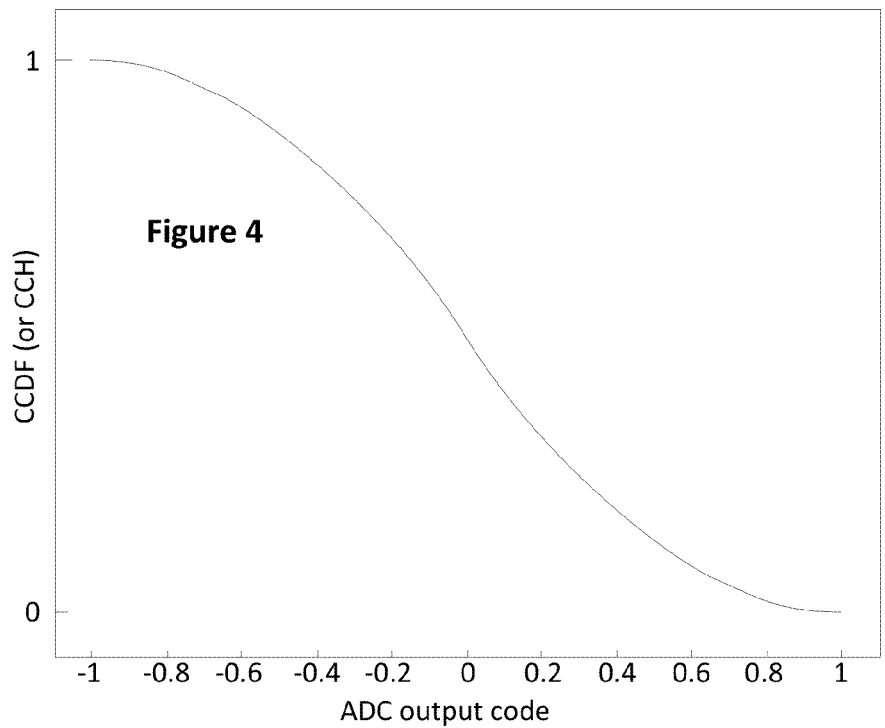

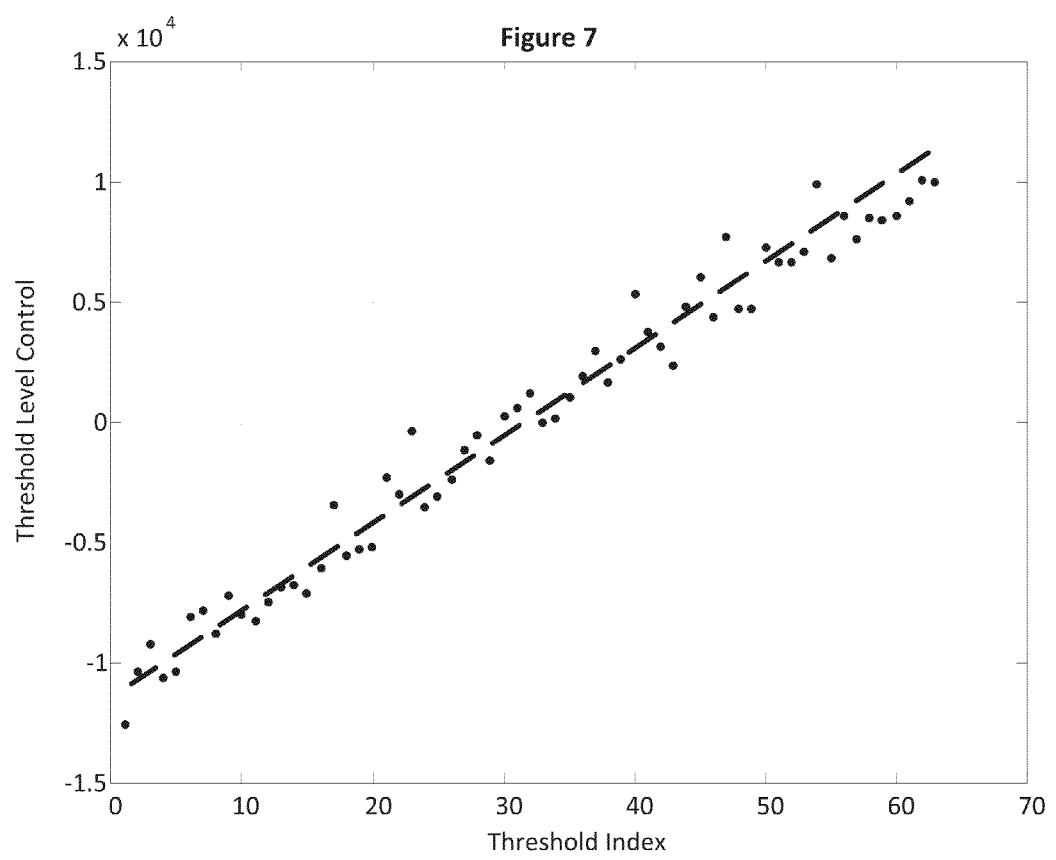

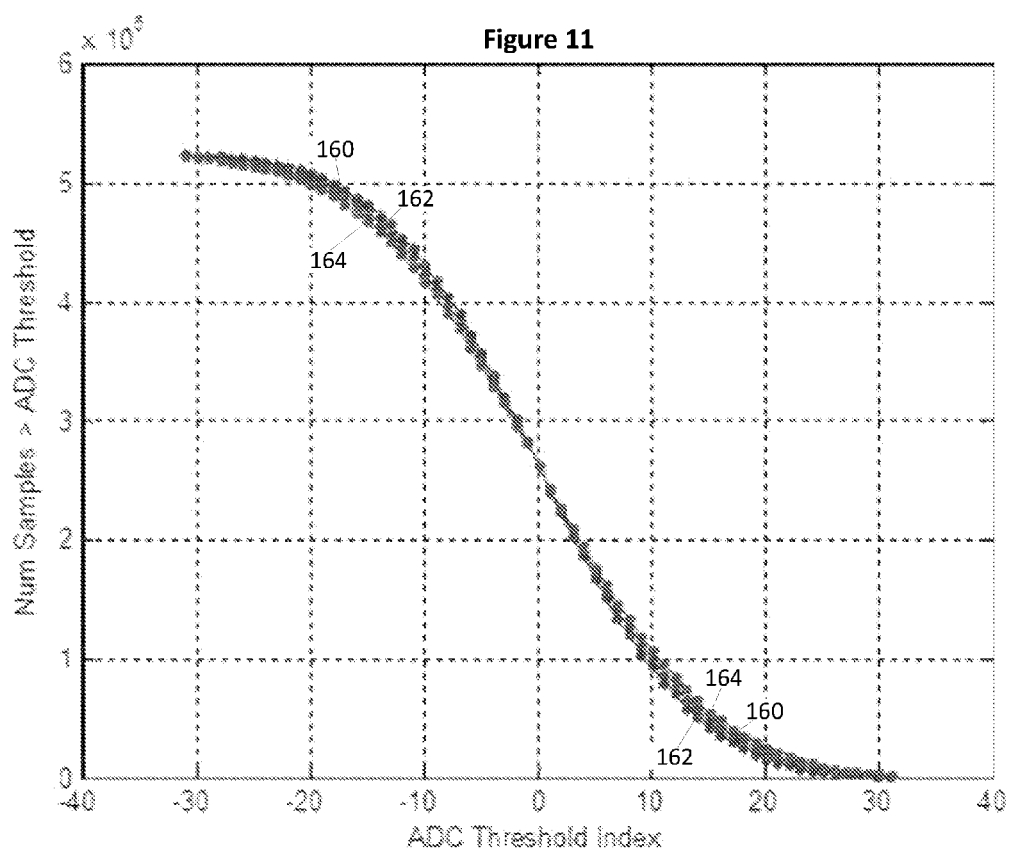
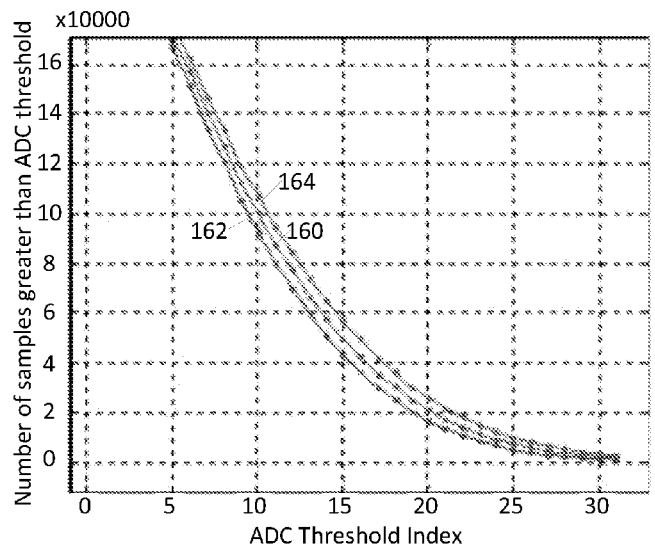

METHOD AND APPARATUS TO CONTROL THE EFFECTIVE GAIN OF A STATISTICALLY CALIBRATED ANALOG TO DIGITAL CONVERTER

FIELD

The present disclosure relates generally to analog to digital converters (ADCs) that are used in data communication. More particularly, the present disclosure relates to the calibration of such ADCs.

BACKGROUND

The ever-increasing speed and resolution requirements of analog to digital converters (ADCs) are an accepted reality. Today's high speed ADCs are measured in hundreds of MHz, GHz, and even tens of GHz. The resolution of an ADC is often characterized by its Effective Number of Bits (ENOB). As these two requirements continue to rise, designers are forced to be more innovative and diligent in their design of ADCs. One approach is to design for speed at the cost of ENOB and employ other methods, such as periodic or continuous calibration, to achieve and maintain the required ENOB levels.

How to periodically or continuously calibrate an ADC is an entire field of research and development that has many factors affecting the choices at hand. For example, does the ADC sample signals continuously, in a periodic time-slot manner, or some other manner where continuous operation is not required? Another example is whether select portions of the ADC can be taken "off-line" to be calibrated without measurably affecting normal ADC operation. A further example is whether there is any a priori information about the input signal that can be exploited to assist in calibrating the ADC.

Therefore, improvements in the control of ADCs are desirable.

SUMMARY

In a first aspect, the present disclosure provides a method of controlling an analog to digital converter (ADC), the ADC receiving an input signal, the ADC having a set of threshold levels, the set of threshold levels being controlled by a pre-defined ADC calibration procedure responsive to a level of an input signal provided to the ADC. The method comprises: a) calculating, as a function of the threshold levels, a metric of the ADC to obtain a calculated metric; b) comparing the calculated metric with a target metric to obtain a comparison value; and c) adjusting, as a function of the comparison value, the level of the input signal to obtain an adjusted input signal level.

In another aspect, the present disclosure provides method of controlling a gain of an analog to digital converter (ADC), the ADC receiving an input signal, the ADC having a set of threshold levels, the set of threshold levels being controlled by a pre-defined ADC calibration procedure responsive to a level of an input signal provided to the ADC. The method comprises: a) calculating, as a function of the threshold levels, a metric of the ADC to obtain a calculated metric; b) comparing the calculated metric with a target metric to obtain a comparison value, the pre-defined ADC calibration procedure being a function of the target metric; and c) modifying the target metric in accordance with the comparison value to obtain a modified target metric.

Other aspects and features of the present disclosure will become apparent to those ordinarily skilled in the art upon review of the following description of specific embodiments in conjunction with the accompanying figures.

BRIEF DESCRIPTION OF THE DRAWINGS

Embodiments of the present disclosure will now be described, by way of example only, with reference to the attached Figures.

FIG. 3 shows plots of estimated Probability Density Function of output codes of an analog to digital converter.

FIG. 4 shows a plot of a complementary cumulative distribution function.

FIG. 7 shows an exemplary mapping of digital to analog converter control words for a 63-threshold analog to digital converter.

FIG. 11 shows an example of a nominal and adjusted complementary cumulative histogram for a number of power level samples having a value higher than that of an ADC threshold as a function of the ADC threshold index.

FIG. 12 shows a close-up view of FIG. 11.

DETAILED DESCRIPTION

The present disclosure relates to ADCs that can operate continuously with calibration occurring unobtrusively by using a priori knowledge of statistics of the ADC's analog input signal. Advantageously, the present disclosure allows the statistics of the input signal to vary without unduly affecting the ADC's calibration process.

Figure 1:
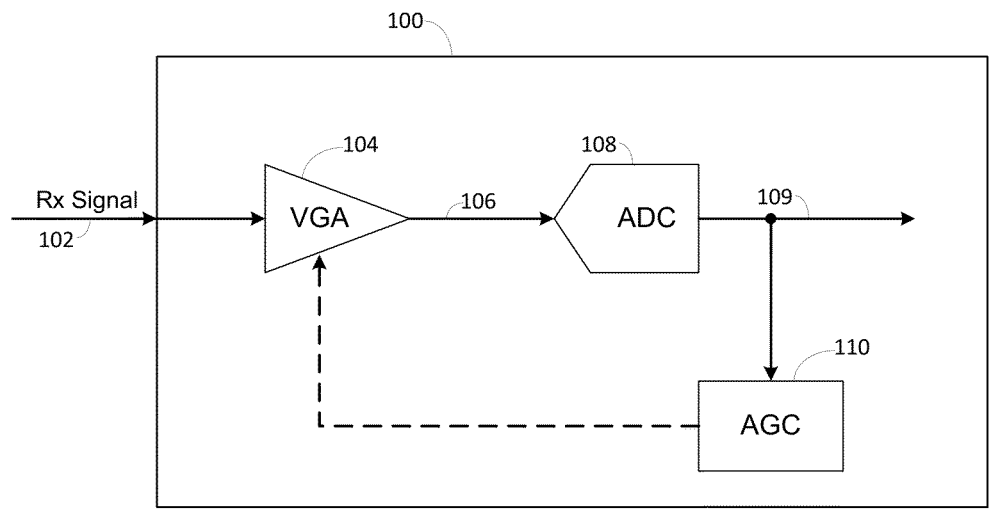
FIG. 1 shows an embodiment digital communication receiver.

FIG. 1 shows an example of a digital communication receiver 100 that receives an analog signal 102 which has a fluctuating power level due to temporal changes in the transmission channel, or other factors. The received analog signal 102 can be amplified by a variable gain amplifier (VGA) 104, which provides an input signal 106, also analog, to an analog to digital converter (ADC) 108. The ADC 108 samples and converts the input signal 106 into a digital signal 109. As is known in the art, if the power level of the input signal 106 were allowed to fluctuate at will, then the available resolution of the ADC 108 would not be fully utilized as sometimes the power level of the input signal 106 may be too low, which results in quantization noise being high relative to the actual signal component. At other times, the power level of the input signal 106 may be too high and excessive clipping of the signal will occur, also resulting in degraded sampled signal quality.

One possible remedy to this problem is to employ the VGA 104, or other similar device, to adjust the power level of the input signal 106 that is supplied to the ADC 108. The gain of the VGA 104 can be controlled by a circuit detecting the power of the analog signal 102 or by detecting the power of the input signal 106, using an analog power detection circuit (not shown). Alternatively, and as shown in FIG. 1, the power level of the input signal 106 can be controlled using a digital circuit located at the output of the ADC 108, in this case, an automatic gain controller (AGC) 110, which measures (samples) the digital signal 109 at the output of the ADC 108, and adjust the gain of the VGA 104 in accordance with (as a function of) the measured power of the digital signal 109 and as a function of a target power. As long as the rate of change of the power level of the received signal 102 is slower than the tracking ability of the AGC 110, the input signal 106 provided to the ADC 108 can have a substantially constant power level. By carefully setting the target power level of the input signal 106, the quality of the sampled data (digital signal 109) can be optimized.

Figure 2:
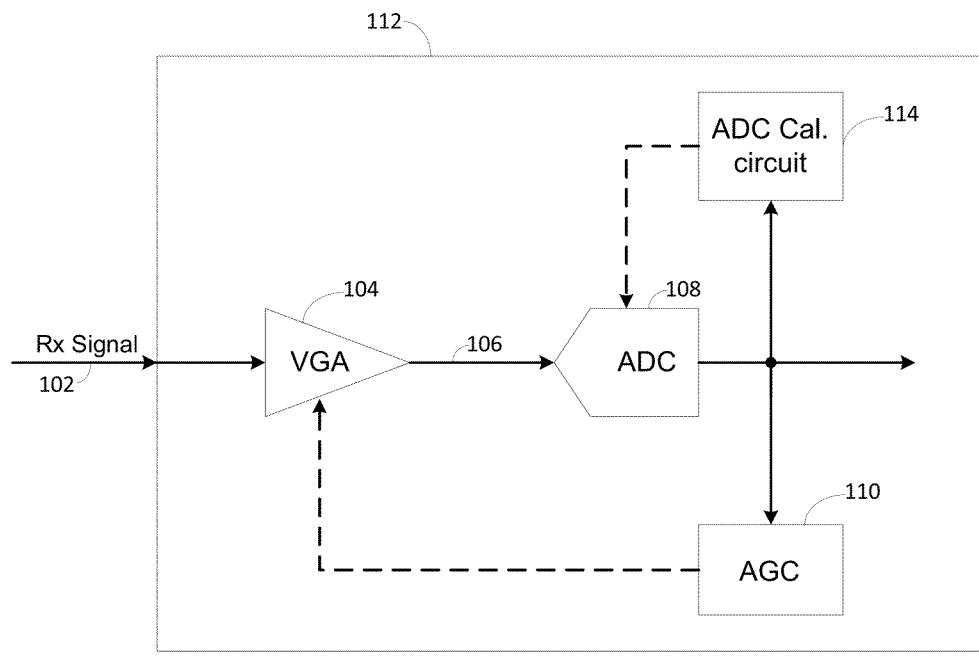
FIG. 2 shows another embodiment of a digital communication receiver.

FIG. 2 shows a system 112 (or digital communication receiver) similar to that of FIG. 1, but one in which periodic and/or continuous calibration of the ADC 108 is performed to maintain the desired effective number of bits (ENOB) of the ADC 108. As an example, calibration of the ADC 108 can be effected by using a priori signal statistics of the analog signal 102; such a calibration process is described in U.S. Provisional Patent Application No. 61/623,411, filed Dec. 4, 2012. In certain applications, some characteristics of the received analog signal 102 (and input signal 106) can be surprisingly constant. For example, in systems using orthogonal frequency-division multiplexing (OFDM) modulation, or systems where the transmission channel has a long impulse response, the received analog signal 102 often has a characteristic Gaussian (noise-like) amplitude distribution. Even as the power level of the received analog signal 102 fluctuates up and down, the Gaussian characteristic is preserved. An ADC calibration circuit 114, which includes threshold controllers, monitors the output of the ADC 108, looking for deviations in the expected Gaussian (or other) characteristic; the ADC calibration circuit can then make adjustments to the threshold controllers to control the threshold levels of the ADC 108 to maintain the expected Gaussian amplitude distribution. The threshold levels are essentially numerical control words, each numerical control word acting as an input to a comparator (not shown). For an N-bit ADC, The number of threshold levels is generally equal to $2^N-1$. As will be understood by the skilled worker, the received analog signal 102 does not need to have a Gaussian amplitude distribution for the above ADC-calibration technique to work. Rather, the analog signal can have any suitable amplitude distribution such as, for example, a uniform distribution, a triangular distribution, a bounded Gaussian distribution, etc.

The impact of the ADC calibration adjustment described in relation to FIG. 2 is shown in FIG. 3. Plot 116 shows the estimated PDF (Probability Density Function) of the output codes of the ADC 108 for a given input signal 106. When the ADC calibration circuit 114 is temporarily suspended, and the input signal 106 is increased in power, while maintaining other statistics, the PDF of the output codes of the ADC 108 change and ends up following plot 118. Due to the change in the power level of the input signal 102, there is a noticeable change in the PDF (from plot 116 to plot 118). Subsequently, the ADC calibration circuit 114 is re-enabled and given time to respond to the change in the power level of the input signal 106. That is, the ADC calibration circuit adjusts the $2^N-1$ threshold levels in accordance to a pre-determined process. Plot 120 shows the PDF of the output codes of the ADC 108 after calibration convergence. It is clear that the PDF has returned to its original shape, despite the change in the input signal power level. The ADC calibration circuit 114, which includes a threshold controller, is doing exactly as intended. However, it is shown below how this can sometimes be a problem.

Instead of tracking the PDF of the output codes of the ADC 108, one can instead track the cumulative distribution function (CDF), or the complementary cumulative distribution function (CCDF) of output codes. The CCDF is equal to 1 minus the CDF. FIG. 4 shows the CCDF (without noise) of the PDF of the plot 116 of FIG. 1. In some cases, it can be advantageous to tract the CCDF in the sense that comparing the CCDF at a given threshold (output code) with at reference CCDF at the same threshold, the skilled worker can immediately determine if the given threshold is too low or too high.

Practically, the PDF can be approximated (calculated) simply by construct a histogram of the number of events recorded (observed) for each output code and divide the number of events for each output code by the total number of events recorded. Similarly, instead of a CDF, one can construct a cumulative histogram based on the histogram of the number of events recorded for each output code. Further, one can obtain a complementary cumulative histogram (CCH) by subtracting the value of the cumulative histogram from the maximum value of the cumulative histogram (CH).

Figure 5:
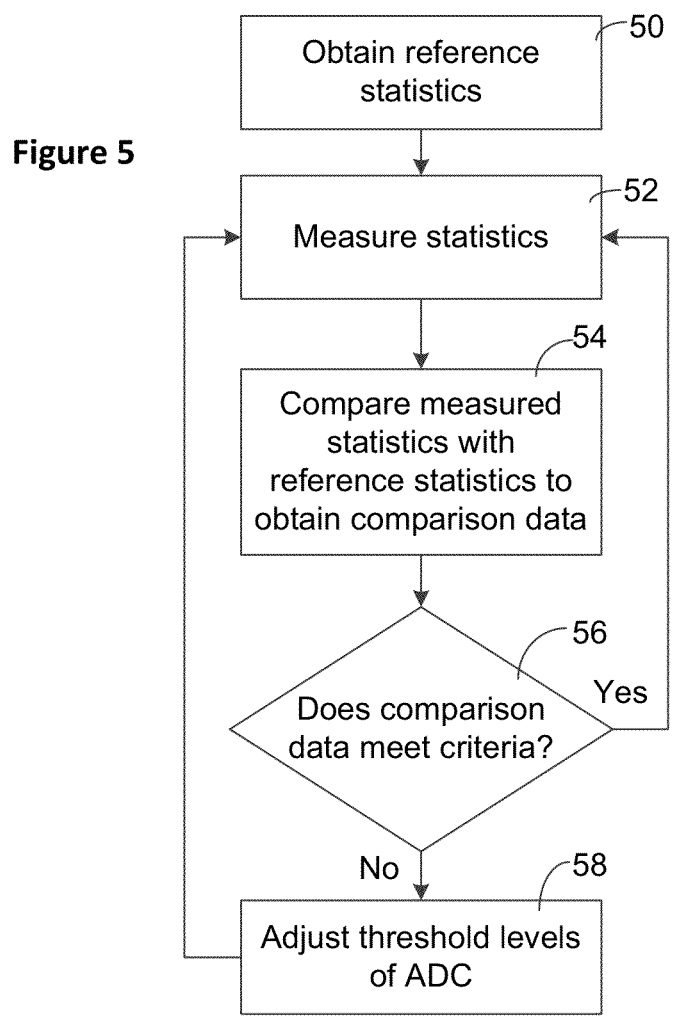
FIG. 5 shows a flowchart of a method of calibrating an analog to digital converter.

FIG. 5 shows a flowchart of a method of calibrating the ADC 108 of FIG. 2. At action 50, the reference statistics of the input signal 106 FIG. 2) when the VGA 104 is set to a nominal gain setting such as, for example, unity gain, can be obtained by measuring the statistics of the digital signal 109, or can be otherwise obtained, for example by using a priori knowledge of the statistics of the analog signal (e.g., Gaussian distribution) and a priori knowledge of the power level of the analog signal. The reference statistics can be the normalized histogram of the number of events per output code, or the CCH, or any other suitable statistical measure of the digital signal 109. At action 52, the statistics of the digital signal 109 (FIG. 2) are measured. At action 54, the statistics measured at action 52 are compared to the reference statistics obtained at action 50. At action 56, it is determined if the comparison effected at action 58 meets a pre-determined criteria. If the criteria is not met, the method proceeds to action 58 where the threshold levels of the ADC 108 (FIG. 2) are adjusted in accordance with the pre-determined process. Subsequent action 58, the method loops back to action 52 where the statistics of the digital signal 109 are measured again. If, at action 56, the criteria is met, the method loops back to action 52.

As described in relation to FIG. 2, simultaneous to the operation of the ADC calibration circuit 114, the AGC 110 monitors the output of the ADC 108 to obtain an estimate of the power of the input signal 106 applied to the ADC 108. When the estimated signal power level drops, the digital circuit (AGC 110) reacts to increase the gain of the VGA 104. When the estimated signal power rises, the AGC 110 reacts to decrease the gain of the VGA 104. In both cases, the power level of the input signal 106 is maintained at a substantially constant level in accordance to the settings of the AGC 110.

Consider the situation in which the ADC calibration circuit 114 assumes that the statistics of the input signal 106 are completely stationary. For example, the signal has a Gaussian distribution and a constant power level. The ADC calibration circuit 114 will adjust the ADC 108 to achieve sampled data having a Gaussian distribution and a specific constant power level, often measured as the variance of the data sampled by the ADC 108. If the input signal 106 has a power level slightly higher or lower than expected, the ADC calibration circuit 114 will adjust the ADC 108 accordingly in response. Now, if the calibration circuit 114 and the AGC 110 are expecting different power levels, a struggle will ensue between the AGC 110 and the ADC calibration circuit 114.

Figure 6A:
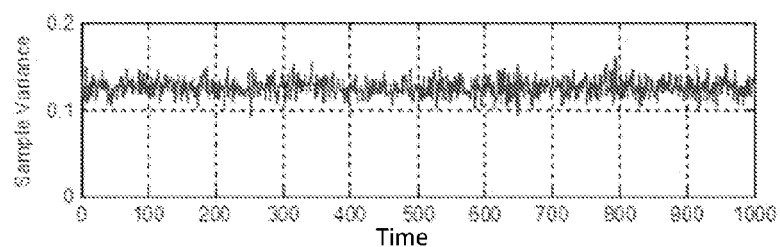
FIG. 6A shows stable sample variance as a function of time.
Figure 6B:
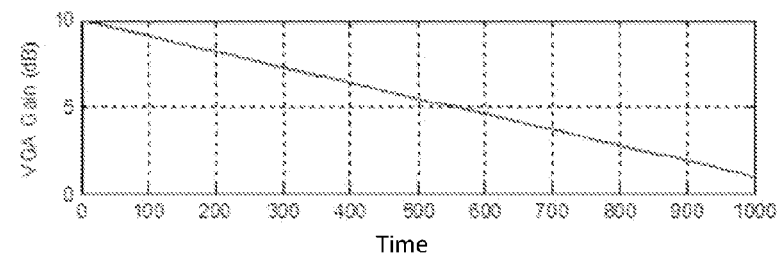
FIG. 6B shows the gain of a variable gain amplifier decreasing as a function of time.
Figure 6C:
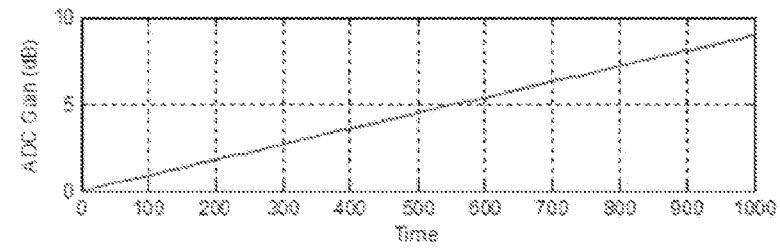
FIG. 6C shows the gain of an analog to digital converter increasing as a function of time.

To illustrate this potential struggle between the AGC 110 and the ADC calibration circuit 114, consider the case where the AGC 110 is expecting a slightly lower power level than the ADC calibration circuit 114. If the input signal 106 has a power level corresponding to that expected by the ADC calibration circuit 114, the AGC 110 will detect the signal as having too much power and will reduce the gain of the VGA 104. The ADC calibration circuit 114 will eventually notice that the power level of the ADC sampled data is too low and will adjust the threshold levels of the ADC 108 accordingly, effectively increasing the gain of the ADC 108. Again, the AGC 110 will detect this increase in power level and further decrease the gain of the VGA 104. FIGS. 6A, 6B, and 6C illustrate this battle of gain control. FIG. 6A shows a stable sample variance as a function of time. FIG. 6B shows the gain of the VGA 104 as a function of time for the same time period as in FIG. 6A. FIG. 6C shows the gain of the ADC 108 as a function of time for the same time period as in FIGS. 6A and 6B. As evidenced by FIGS. 6B and 6C, the gain of the VGA 104 and the gain of the ADC 108 drift in opposite directions trying to maintain a constant sample data variance. This battle will continue until the VGA 104 is at its minimum gain setting, or the ADC 108 is at its limits of calibration adjustments. In either case, the quality of the sampled data will likely be degraded well beyond system requirements.

Consider another case where the AGC 110 is expecting a slightly higher power level than the ADC calibration circuit 114. If the input signal 106 has a power level corresponding to that expected by the ADC calibration circuit 114, the AGC 110 will detect the signal as having too little power and will increase the gain of the VGA 104. The calibration circuit 114 will eventually notice that the power level of the digital signal 109 from the ADC 108 is too high and will adjust the threshold levels of the ADC 108 accordingly, effectively decreasing the gain of the ADC 108. Again, the AGC 110 will detect this decrease in power level and further increase the gain of the VGA 104. In a manner similar to the previous case, this battle will continue until the VGA 104 is at its maximum gain setting, or the ADC 108 is at its limits of calibration adjustments. In either case, the quality of the sampled data will likely be degraded well beyond the system requirements.

The worker possessing ordinary skill in the art will immediately recognize that the AGC 110 and the ADC calibration circuit 114 will always fight each other, even in the case where the data power levels expected by both are identical. Residual perturbation or variation in the control loop can, in most cases, cause the ADC calibration circuit 114 and the AGC 110 to fight. Eventually, this fight can cause a large enough drift between the ADC calibration circuit 114 and the AGC 110 to unacceptably degrade the quality of the sampled data.

The present disclosure can prevent the ADC calibration circuit 114 from responding to changes in the power level of the input signal 106. Deviations from the Gaussian, or other expected distribution, can continue to be tracked and removed by the calibration circuit 114.

The following identifies a mechanism to detect the change in the effective gain of the ADC 108 and identifies several alternative mechanisms to encourage the gain of the ADC 108 to return to its original level. By controlling the gain of the ADC 108, struggles such as those described above in relation to the AGC 110 and the threshold controller 114 can be averted.

In the exemplary ADC 108 of FIGS. 1 and 2, the threshold levels of the ADC are controlled by a precision digital to analog converter (DAC). Each ADC threshold level is set by occasionally/periodically programming a control word into the precision DAC. During such calibration, each DAC control word is slowly adjusted up or down as needed to maintain desired output statistics of the digital signal 109. Those knowledgeable in the art will recognize that the calibration technique set out in U.S. patent application Ser. No. 13/766,855, filed on Feb. 14, 2013, is based on maintaining Complementary Cumulative Distribution Function (CCDF) statistics of the data sampled at the output of the ADC 108, which relates to the PDF statistics referred to in above discussions.

FIG. 7 shows an exemplary mapping of DAC control words for a 63-threshold ADC (i.e., a 6-bit ADC). The higher ADC indices (threshold index axis) represent the higher voltage ADC thresholds and thus have positive DAC control words. The lower ADC indices represent the lower voltage ADC thresholds and thus have negative DAC control words (in this example the input signal has a mean value of zero volts with instantaneous positive and negative voltage levels). The individual dots represent the intended output levels of the 63 individual precision DACs as specified by the control words. Ideally, these control words should follow a straight line trend. However, due to manufacturing variations within the ADC thresholds and the precision DACs, the required DAC control word will vary about the ideal and may even be non-monotonic.

Assuming a linear model (e.g., y=m*x+b) for the control word mapping of FIG. 7, the metric "m" can be computed through equation 1:

$$m = \frac{\sum X_i Y_i - \frac{1}{n} \sum X_i \sum Y_i}{\sum (X_i^2) - \frac{1}{n}(\sum X_i)^2}$$

where $X_i$ are the threshold index values of the horizontal axis and $Y_i$ are the Threshold Level Control values of the vertical axis. The summation term ranges from i=1 to n, n=$2^N$-1, with N being the number of bits in the ADC.

The range of control words over which this metric is computed can be the full range (of control words), or a partial subset, such as, for example, the middle 50%, or any other suitable subset. The above equation is the well-known MMSE (Minimum Mean Squared Error) linear regression. In the full linear regression equation, the denominator is constant and thus can be ignored for our purposes here. As will be understood by the skilled worker, modeling of the control word mapping may be achieved with models other than the linear model above. For example, modeling with a polynomial of any order could be done, which would lead to a different metric (or different metrics) for the control word mapping. However, as ADCs are generally meant to exhibit a linear behavior, the above-noted linear model can be suitable.

The metric "m" defined by the above equation provides a reciprocal measure of the ADC gain. A larger computed metric "m" implies the ADC has a decreased gain, while a smaller computed metric "m" implies that the ADC has an increased gain. The threshold levels can be monitored continuously or periodically, and the metric "m" can be calculated accordingly. Monitoring of the threshold levels and calculation of the metric "m" can be effected by any processor operationally connected to the ADC.

With the metric defined in accordance with the above equation, it is possible to detect changes in the ADC gain. The following discloses two examples of mechanisms to control the gain of the ADC 108. Each of these mechanisms can have hardware and software options for implementation. The two mechanisms differ in their complexity and their impact on operation.

Figure 8:
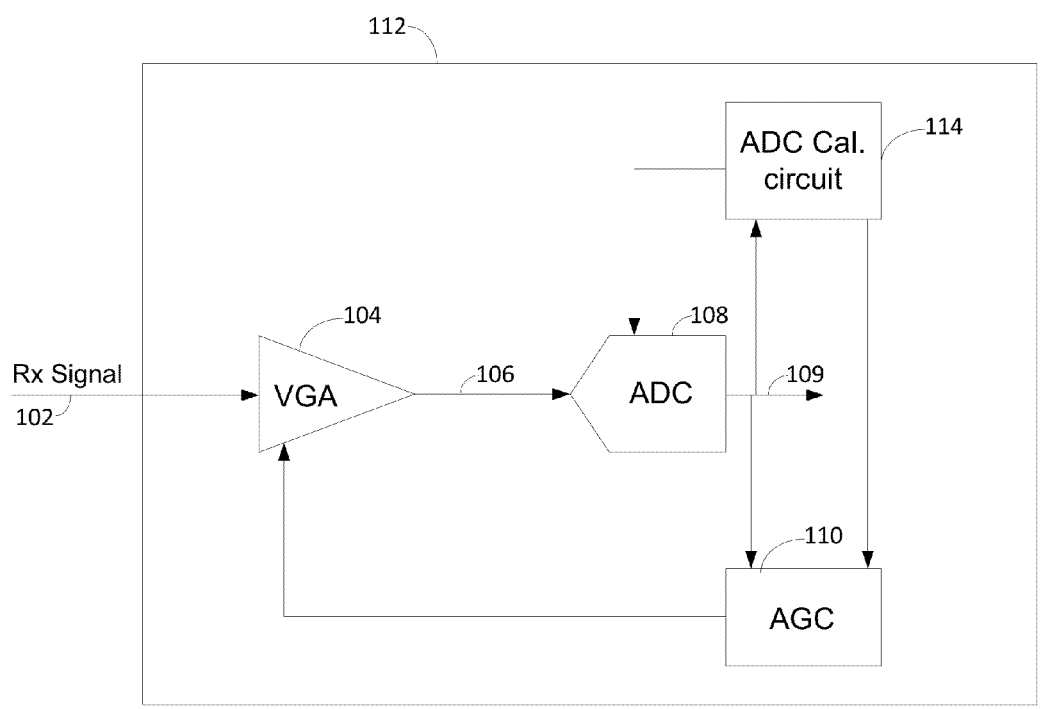
FIG. 8 shows an embodiment digital communication receiver in accordance with the present disclosure.

In the first mechanism, the ADC gain is maintained to a pre-determined value through modulation of the AGC target power level. The basic concept is described as follows with reference to FIG. 8.

The ADC calibration circuit 114 samples the digital signal 109 and adjusts the threshold levels of the ADCs. This can be effected by, for example, calculating the complementary cumulative histogram (CCH) of the samples of the digital signal and dividing the CCH by the number of samples to obtain a normalized CCH. Based on this normalized CCH, the ADC calibration circuit 114 adjusts the threshold levels. Subsequently, the metric "m" is calculated, for example, by the ADC calibration circuit 114 or by any processor operationally connected to the ADC calibration circuit, and compares the calculated value of the metric "m" with a target value (a pre-determined value) of the metric "m". When the gain of the ADC is detected as being lower than a pre-determined ADC gain (target ADC gain), i.e., when it is determined that the metric "m" is higher than a pre-determined metric value (target metric value), the AGC target power level is lowered by the AGC circuit 110. When the AGC control loop responds and lowers the power of input signal 106 input into the ADC 108, the ADC calibration circuit 114 will detect that the ADC output signal (the digital signal 109) has too little power and will adjust the gain of the ADC 108 (by adjusting the value of the threshold levels) upward toward the target ADC gain, which will decrease the value of the metric "m" toward the target metric value.

When the gain of the ADC 108 is detected as being higher than a pre-determined ADC gain (target ADC gain), i.e., when it is determined that the metric "m" is lower than a pre-determined metric value (target metric value), the AGC target power level is increased by the AGC circuit 110. When the AGC control loop responds and increases the power of the input signal 106 input into the ADC 108, the ADC calibration mechanism will detect that the ADC output signal (the digital signal 109) has too much power and will adjust the gain of the ADC 108 (by adjusting the value of the threshold levels of the ADC) downward toward the target ADC gain, which will increase the value of the metric "m" toward the target metric value.

Those skilled in the art may recognize that a large step change in an AGC target power level may have negative consequences (e.g., the background calibration of threshold levels may not occur uniformly for all thresholds, thus large step changes may have undesired short term effects on the sampled signal statistics), thus it can be desirable to keep the step change (change in target power level at output of ADC 108) as small as possible. However, a step change that is too small may not guarantee that the power level of the input signal 106 to the ADC 108 changes enough to cause the ADC calibration circuit (threshold controller) to begin drifting in the opposite direction. To address this conflict of requirements, a multilevel AGC setpoint approach can be defined.

Figure 9:
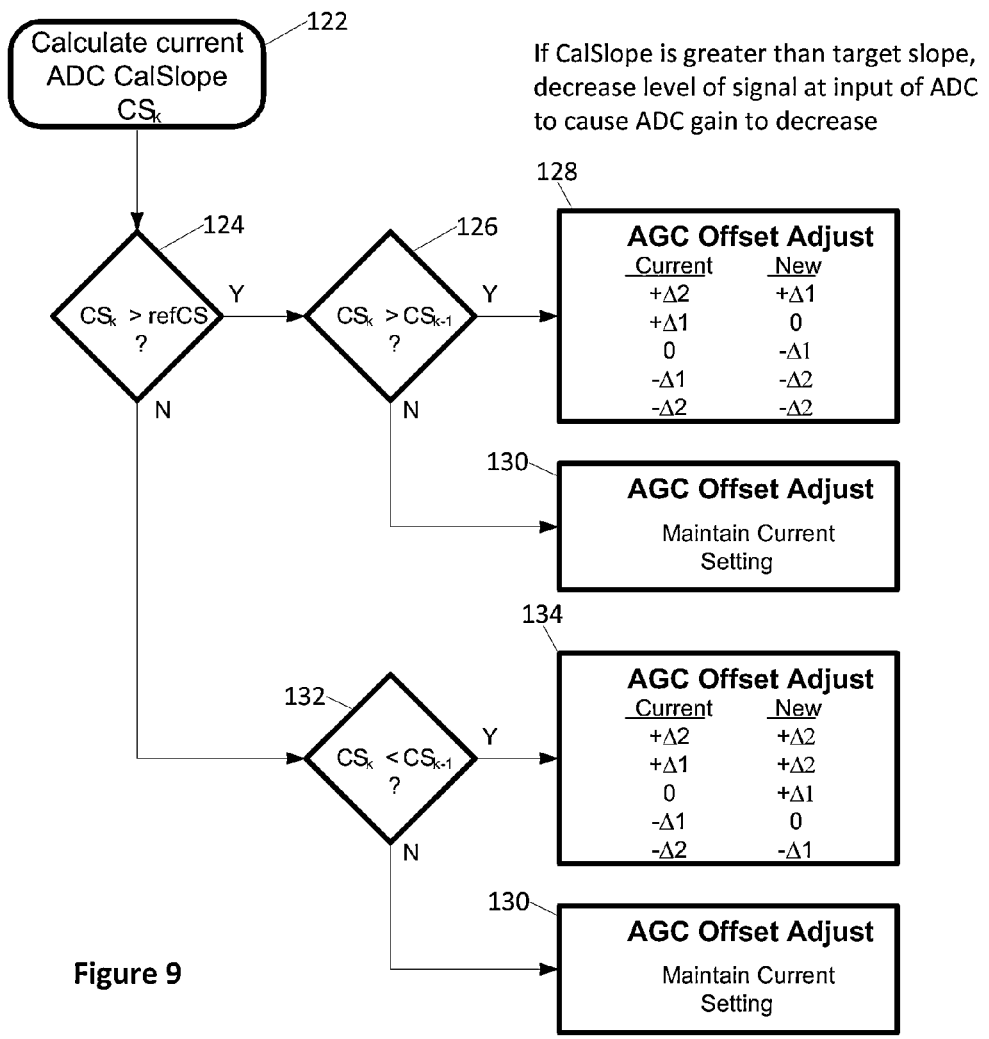
FIG. 9 shows an embodiment of a control state machine in accordance with certain embodiments of the present disclosure.

FIG. 9 shows an example of a five-level AGC setpoint control state machine. Those skilled in the art will see that it is relatively simple to extend this concept to other levels of control. The basic concept of this state machine is to measure (calculate) and monitor the ADC metric "m", which can also be referred to as the calibration slope (CalSlope) and make adjustments to the AGC setpoint (target power level) as required. When an adjustment to the AGC setpoint (or offset) does not have the intended effect on the next computed calibration slope, a further adjustment to the AGC offset is made in the same direction as the previous adjustment. Thus, a larger range of AGC offset control is achieved without requiring changes in offset to be too large.

With respect to FIG. 9, at 122, the calibration slope $CS_k$ ("m") of the ADC is calculated, using the threshold levels of the ADC, which are set as a function of samples of the digital signal 109, by using the above-noted equation 1 for the ADC metric "m". Subsequently, at 124, a determination is made if $CS_k$ is larger than a reference calibration slope (pre-determined calibration slope or target calibration slope "reference m") refCS. If $CS_k$>refCS, the state machine proceeds to 126 to determine if $CS_k$ is larger than the previously determined calibration slope $CS_{k-1}$. If $CS_k$>$CS_{k-1}$, the state machine proceeds to 128 where the target power level (setpoint) of the AGC 110 is lowered by a pre-determined amount. The state machine then returns to 122. If, at 126, it is determined that $CS_k$ is not larger than $CS_{k-1}$, the state machine proceeds to 130 where the target power level (setpoint) of the AGC 110 is maintained.

If, at 124, it is determined that $CS_k$ is not larger than refCS, the state machine proceeds to 132 where it is determined if $CS_k$ is less than the previously determined calibration slope $CS_{k-1}$. If $CS_k$<$CS_{k-1}$, the state machine proceed to 134 where the target power level (setpoint) of the AGC 110 is increased by a pre-determined amount. The state machine then returns to 122.

If, at 132, it is determined that $CS_k$ is not larger than $CS_{k-1}$, the state machine proceed to 130 where the target power level (setpoint) of the AGC 110 is maintained. The state machine then returns to 122. As will be understood by the skilled worker, the previously determined calibration slope $CS_{k-1}$ is simply the calibration slope calculated one iteration prior to the calculation of $CS_k$. With respect to the set point of the AGC, it can be expressed in power units of the input signal 106 (FIG. 8) or in terms of percentage or decibel gain of an input signal of a pre-determined power level.

Figure 10:
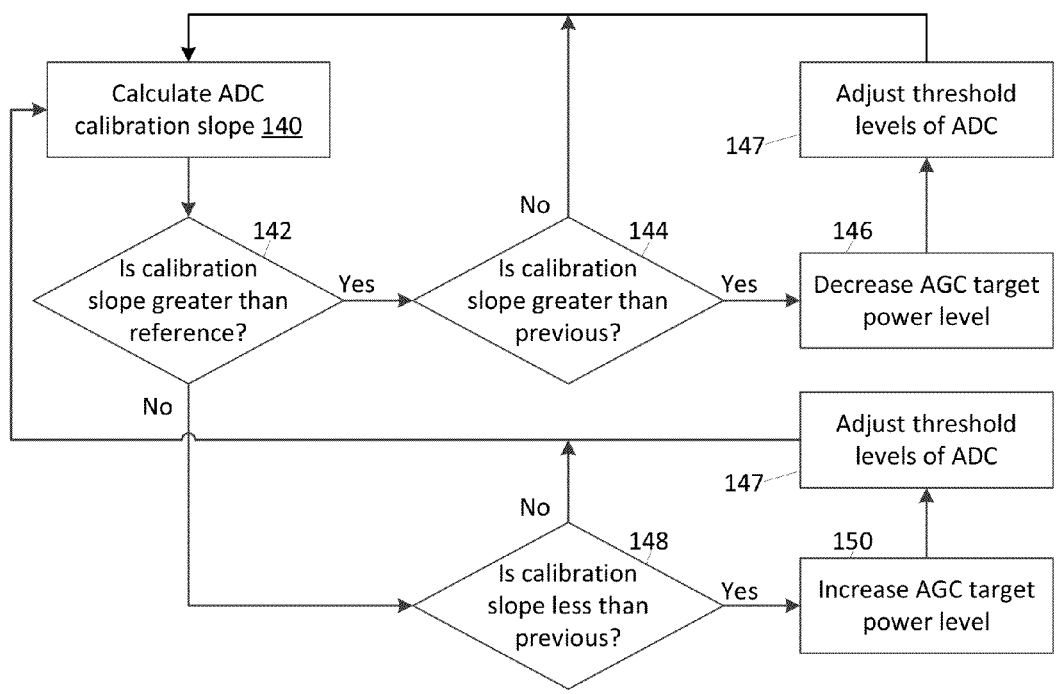
FIG. 10 shows a flowchart of a method in accordance with certain embodiments of the present disclosure.

FIG. 10 is a flowchart of a method according to state machine of FIG. 9. In FIG. 10, at action 140, the ADC calibration slope is calculated as a function of the threshold levels of the ADC, as per equation 1 above. At action 142, a determination is made as to whether the calibration slope calculated at 140 is greater than a pre-determined reference calibration slope (target calibration slope). The determination can be made by comparing the calculated calibration slope obtained at 140 with a target calibration slope. If the calibration slope calculated at 140 is greater than the pre-determined reference calibration slope, the method proceeds to action 144 where a determination is made as to whether the calibration slope determined at 140 is greater than a previously calculated calibration slope. If the calibration slope calculated at 140 is greater than the previously calculated calibration slope, the method proceeds to action 146 where the target power level of the AGC 110 is decreased, which causes the ADC to change its threshold levels at action 147, and the method proceeds back 140. If, at action 144, it is determined that the calibration slope calculated at 140 is not greater that the previously calculated calibration slope, the method can proceed back to action 140.

If, at action 142, it is determined that the calibration slope calculated at 140 is not greater than the pre-determined reference calibration slope, the method proceeds to action 148 where a determination is made as to whether the calibration slope calculated at action 140 is lower that the previously calculated calibration slope. It the calibration slope calculated at action 140 is lower than the previously calculated calibration slope, the method proceeds to action 150 where the target power level of the AGC 110 is increased, which causes the ADC to change its threshold levels at action 147, and the method proceeds back 140. Otherwise, the method proceeds from 148 back to 140.

The adjustment of the threshold levels of the ADC that occurs at action 147 is part of the calibration process of the ADC described in U.S. patent application Ser. No. 13/766,855, filed on Feb. 14, 2013.

Alternatively, a more complicated, but direct, control of the ADC gain is also possible. By directly changing the reference statistics used by the ADC calibration mechanism, it is possible to cause the ADC calibration mechanism to adapt the ADC thresholds such that the effective gain of the ADC is returned to the desired level. An effective means of changing the reference statistics is to scale the horizontal axis of the CCH data.

FIG. 11 (and the close up in FIG. 12) shows an example of a nominal and adjusted CCH for a number of power level samples having a value higher than that of an ADC threshold as a function of the ADC threshold index. Note that the horizontal axis has been altered relative to previous plots showing ADC threshold index. The index now assumes a negative to positive range instead of positive one only. As will be understood by the skilled worker, this change simplifies the implementation of this variation of the invention. In FIGS. 11 and 12, the plot 160 represents the nominal, reference, or target CCH used in the following example of ADC Calibration. The plots 162 and 164 are rescaled versions of plot 160, where the rescaling is carried out only for the abscissa (ADC Threshold Index). For example:

Threshold index value (Plot 162)=Threshold index value (Plot 160)*10$^{+0.5/20}$ Threshold index value (Plot 164)=Threshold index value (Plot 160)*10$^{5/20}$ Generally speaking, when the computed metric ("m") is too high, we want to replace the reference CCH statistics with data that is closer to plot 164, and when the computed metric is too low, we want to replace the reference CCH statistics with data that is closer to the plot 162. When the scaled ADC threshold index value is not an exact integer, the plot 160 can be interpolated to obtain an exact integer.

The rescaling of the Threshold index value axis can be expressed as:

Threshold index value (Rescaled Plot)=Threshold index value (Ref_plot)*10$^{-f(p)/20}$ where "p" is an integer value and f(p) is a function of "p", with "p" being a function of "m"; f(p) represent a change in power expressed in decibels (dB). Possible values of f(p) can be pre-determined. Table I below shows an example of pre-determined values of f(p) for different values of "p".

TABLE I

| p | f(p) |
|---|------|
| 1 | −1.0 |
| 2 | −0.5 |
| 3 | 0    |
| 4 | 0.5  |
| 5 | 1.0  |

Figure 13:
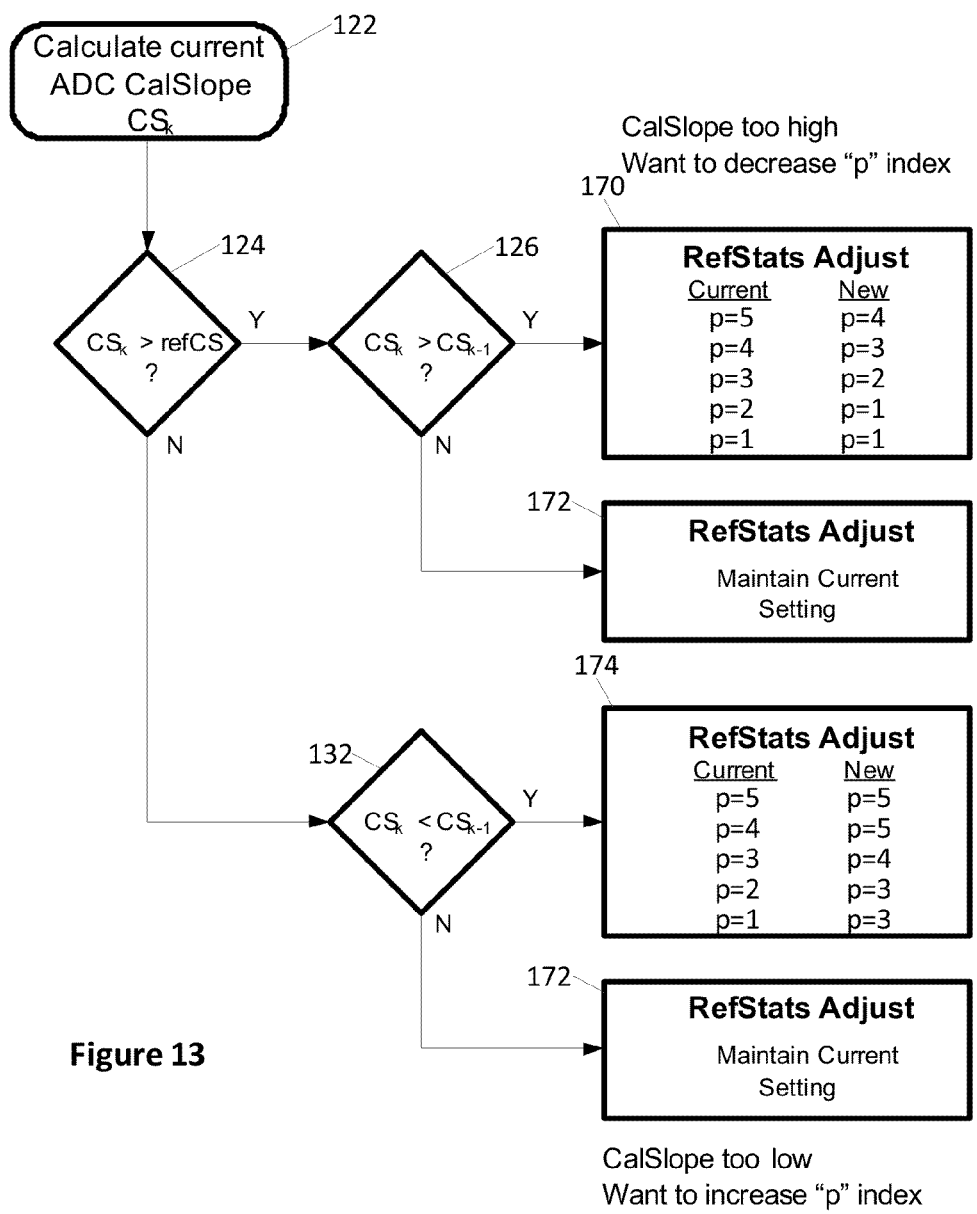
FIG. 13 shows another embodiment of a control state machine in accordance with certain embodiments of the present disclosure.

FIG. 13 shows an example of a robust state-machine control algorithm that allows small step sizes in the CCH adjustments, but with a larger control range than could be supported with a single pair of adjusted CCHs. Five levels are shown (p=1 to p=5), but this can easily be extended. In the state machine example of FIG. 13, a value of p=3 represents the use of the nominal CCH (reference statistics) by the ADC calibration circuit 114. Larger values of "p" identify adjusted CCH statistics where the threshold index has been compressed, as exemplified by plot 162 in FIGS. 11 and 12. Smaller values of "p" identify adjusted CCH statistics where the index has been expanded, as exemplified by plot 164 in FIGS. 11 and 12.

The state-machine based CCH adjustment technique for controlling the effective gain of the ADC can be implemented in either software or hardware. Furthermore, the adjusted statistics can be computed "on-the-fly" as needed, or multiple variations can be pre-computed and stored for simple look-up reference as needed. The computation of the ADC gain metric "m" can also be performed in either hardware or software as the application permits.

With respect to FIG. 13, at 122, the calibration slope $CS_k$ ("m") of the ADC is calculated by using the above-noted equation 1. Subsequently, at 124, a determination is made if $CS_k$ is larger than a reference calibration slope (pre-determined calibration slope) refCS. If $CS_k$>refCS, the state machine proceeds to 126 to determine if $CS_k$ is larger than the previously determined calibration slope $CS_{k-1}$. If $CS_k$>$CS_{k-1}$, the state machine proceed to 170 where the "p" index is reduced. This results in changing (adjusting) the reference statistics, which results in changing the reference calibration slope. The state machine then returns to 122.

If, at 126, it is determined that $CS_k$ is not larger $CS_{k-1}$, the state machine proceed to 172 where the "p" index is maintained.

If, at 124, it is determined that $CS_k$ is not larger than refCS, the state machine proceeds to 132 where it is determined if $CS_k$ is less than the previously determined calibration slope $CS_{k-1}$. If $CS_k$<$CS_{k-1}$, the state machine proceed to 174 where the "p" index is increased. This results in changing (adjusting) the reference statistics, which results in changing the reference calibration slope. The state machine then returns to 122.

If, at 132, it is determined that $CS_k$ is not larger $CS_{k-1}$, the state machine proceed to 172 where the "p" index is maintained.

Figure 14:
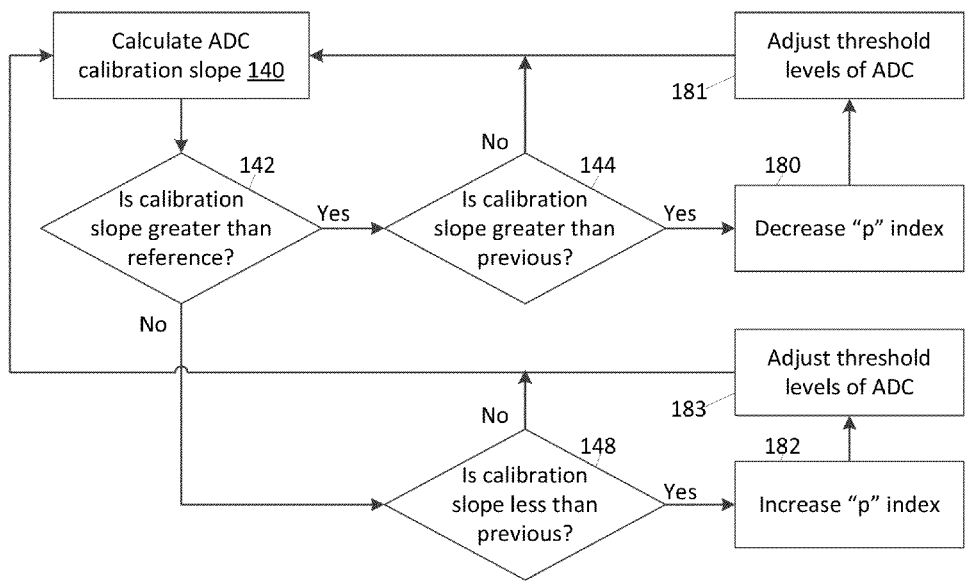
FIG. 14 shows another flowchart of a method in accordance with certain embodiments of the present disclosure.

FIG. 14 is a flowchart of a method according to certain examples of the present disclosure. At action 140, the ADC calibration slope is calculated. At action 142, a determination is made as to whether the calibration slope calculated at 140 is greater than a pre-determined reference calibration slope. If the calibration slope calculated at 140 is greater than the pre-determined reference calibration slope, the method proceed to action 144 where a determination is made as to whether the calibration slope determined at 140 is greater than a previously calculated calibration slope. If the calibration slope calculated at 140 is greater than the previously calculated calibration slope, the method proceeds to action 180 where the "p" index is decreased and the method proceeds to action 181 where the threshold levels of the ADC are adjusted, which results in changing the reference calibration slope. The method then proceeds to action 140. If, at action 144, it is determined that the calibration slope calculated at 140 is not greater that the previously calculated calibration slope, the method can proceed back to action 140.

If, at action 142, it is determined that the calibration slope calculated at 140 is not greater than the pre-determined reference calibration slope, the method proceed to action 148 where a determination is made as to whether the calibration slope calculated at action 140 is lower that the previously calculated calibration slope. It the calibration slope calculated at action 140 is not lower that the previously calculated calibration slope, the method proceeds to action 182 where the "p" index is increased and the method proceeds to action 183 where the threshold levels of the ADC are adjusted, which results in changing the reference calibration slope. The method then proceeds to action 140. Otherwise, the method proceeds from 148 back to 140.

Figure 15:
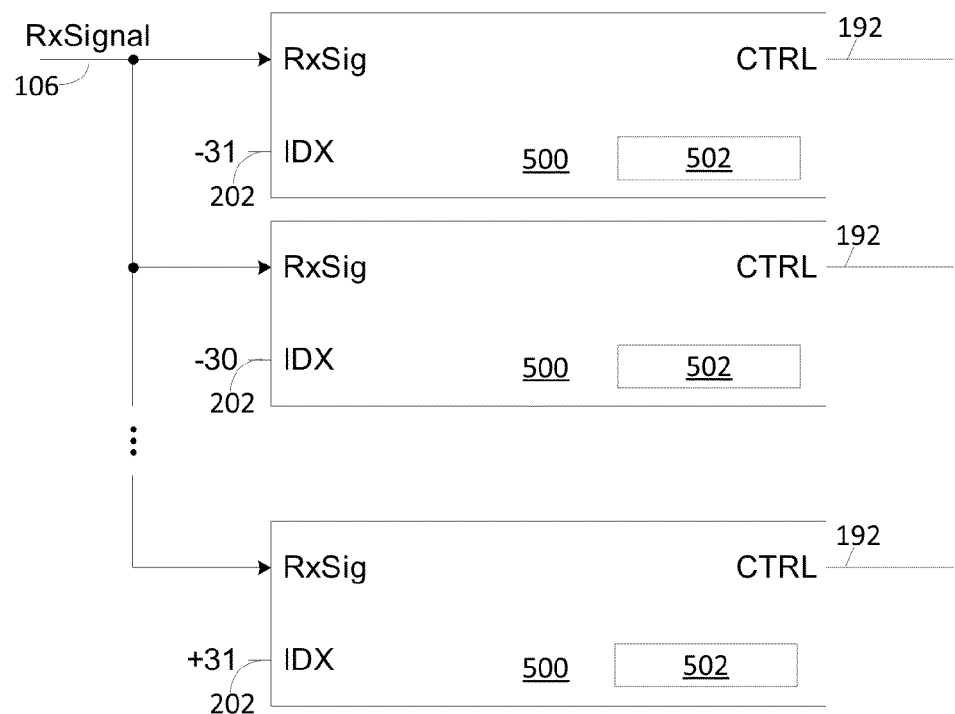
FIG. 15 shows a prior art analog to digital calibration circuit.
Figure 16:
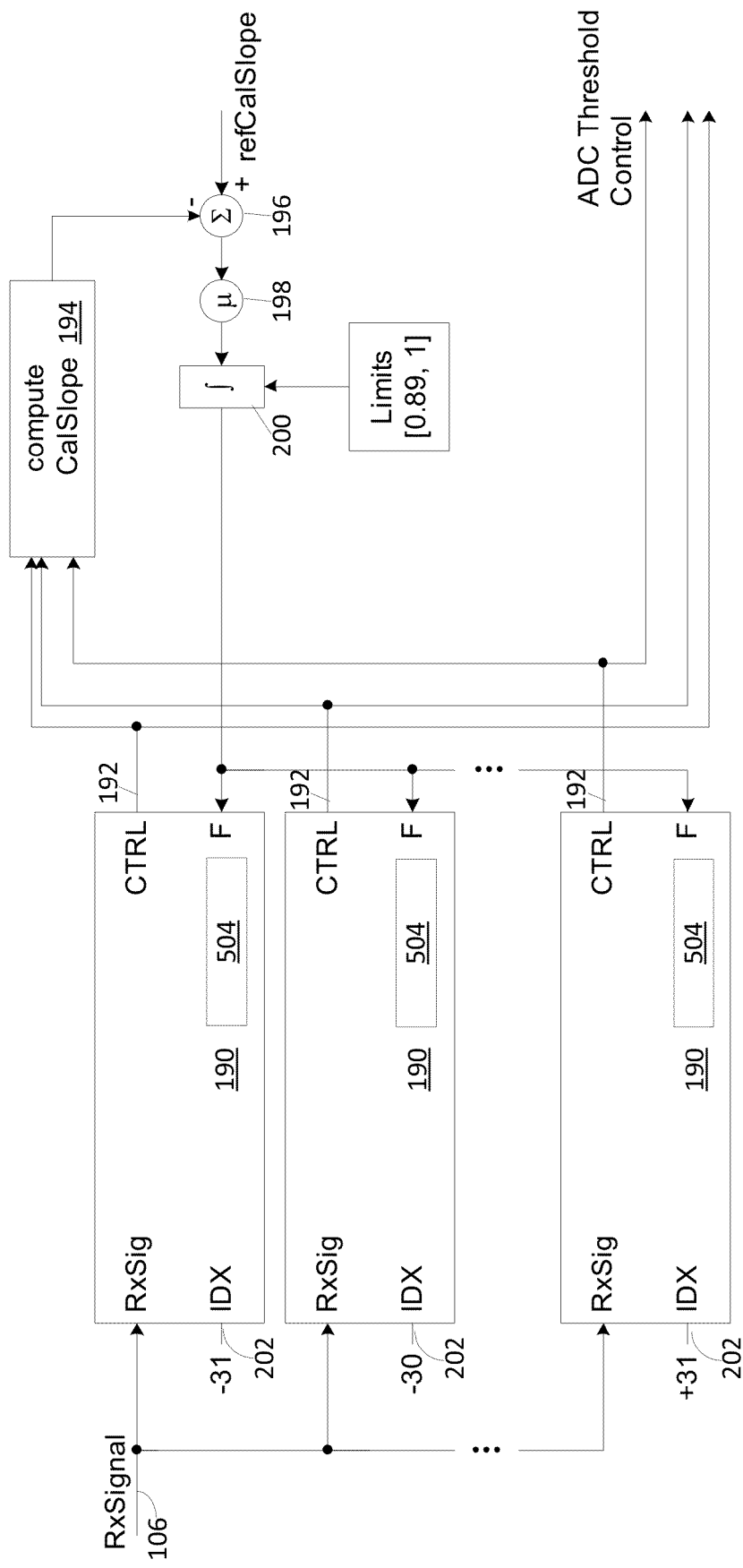
FIG. 16 shows an embodiment of analog to digital calibration circuitry in accordance with the present disclosure.
Figure 17:
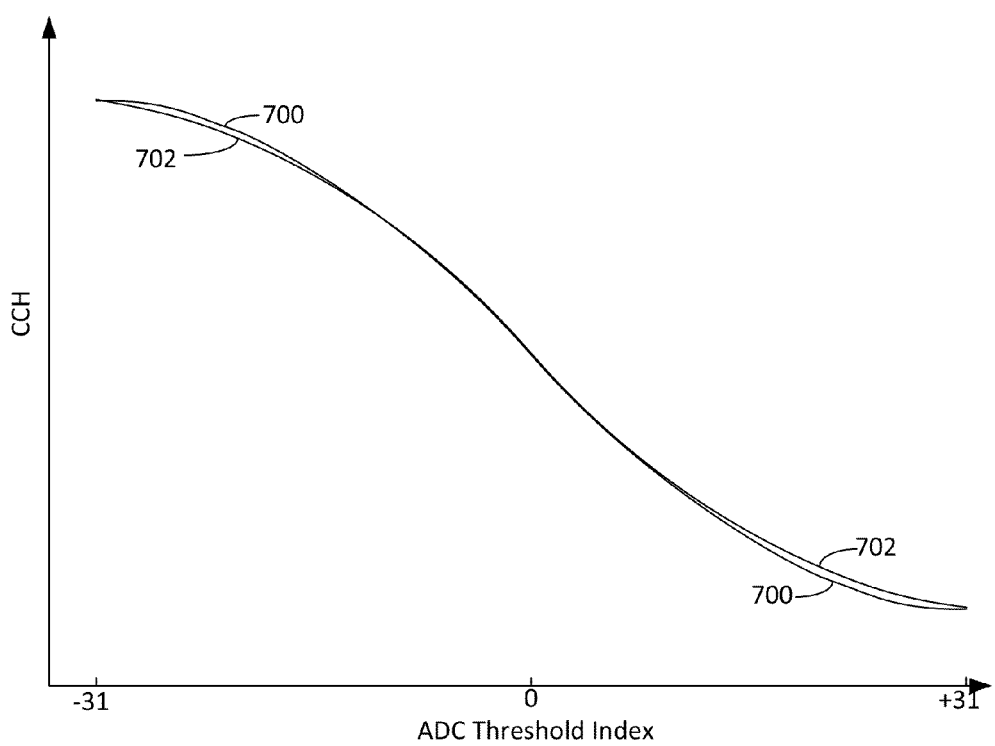
FIG. 17 shows two plots of complementary cumulative histograms for two signals having different power levels.

FIG. 15 shows a prior art ADC calibration circuit 500 that can include as many ADC calibration blocks 500 as there are thresholds levels in the ADC. In the present example, there are 63 such threshold levels (6-bit ADC). Each block 500 receives the input signal 106 as an input. Each block 500 comprises reference statistics 502 or has access to reference statistics 502 that may be stored elsewhere and which can be, for example, CCDF statistics scaled by the number of samples taken to calculate the CCDF statistics. Each block 500 has a CTRL output 192. The CTRL output 192 of each block 500 represents the DAC control word used to set the threshold level for the ADC's comparator (not shown). The threshold levels determine the output statistics of the ADC. By measuring the output statistics of ADC 108 and by comparing the output statistics to the reference statistics 502, it is possible, based on that comparison, to adjust the control words such as to have the output statistics conform to the reference statistics In accordance with the present disclosure, an exemplary technique of modifying the reference CCH (reference statistics 502) to control the effective gain of the ADC can be further refined as shown in FIG. 16. FIG. 16 shows calibration blocks 190 that are logically applied to each of the ADC thresholds (63 in this example: −31, . . . 0, . . . +31). Each calibration block 190 comprises reference statistics 504 or has access to reference statistics 504. The reference statistics 504 can be used to calculate a reference calibration slope, as mentioned above. The CTRL output 192 from each BG Cal block 190 represents the DAC control word used to set the threshold level for the ADC's comparator. The collection of N (in this example N=63) control words (or a subset) are processed, at the compute CalSlope block 194, to compute the ADC gain metric (CalSlope). At 196, the computed metric (output of 194) is compared to a target value or reference computed metric (refCalSlope); the difference between the CalSlope and refCalSlope is scaled by a factor μ 198, which can be significantly less than 1; the scaled difference is then integrated at 200, which can be, for example, any suitable type of digital integrator. The integrated value can be optionally clamped at defined maximum (e.g, 1) and minimum (e.g., 0.89) values to prevent excessive drift of the processed metric. Effectively, the clamping of the integrated value also limits the range of variation that can be introduced into the CCH for purposes of ADC gain control. The upper range (1) of the above clamping range example ([0.89, 1]) is consistent with the reference CCH having been obtained at an input signal power level lower than the desired or likely input signal power level. FIG. 17 shows a plot 700 of a CCH collected at a power level that is lower than that of the desired input signal power level. The plot 702 shows a CCH collected at the desired input signal power level.

Referring again to FIG. 16, the processed metric value output resulting from the integration at 200, labeled as "F", is fed back into each calibration blocks 190. Within each calibration block 190, the processed metric "F" is used as the desired scalar of the reference statistics 504 (RefStats) horizontal axis. For example, for any integrated value within the range [0.89, 1]. Modifying the reference statistics 504 results in modifying the reference calibration slope. Each copy of the calibration block 190 is dedicated to a single ADC threshold, as indicated by the IDX entry 202. For values of "F" below 1, the block will compute the value of the RefStats at the modified IDX index, including fractional values which may not be supported by the unmodified IDX values. The interpolated RefStat is provided to the original ADC calibration mechanism. That is, this variation of the disclosure acts as a wrapper of the existing ADC calibration mechanism and not a direct modification. A benefit of this approach is that the untouched ADC calibration mechanism does not need to be re-verified during instantiation in silicon or other semiconductor process, and only the additional wrapper items require verification.

Figure 18:
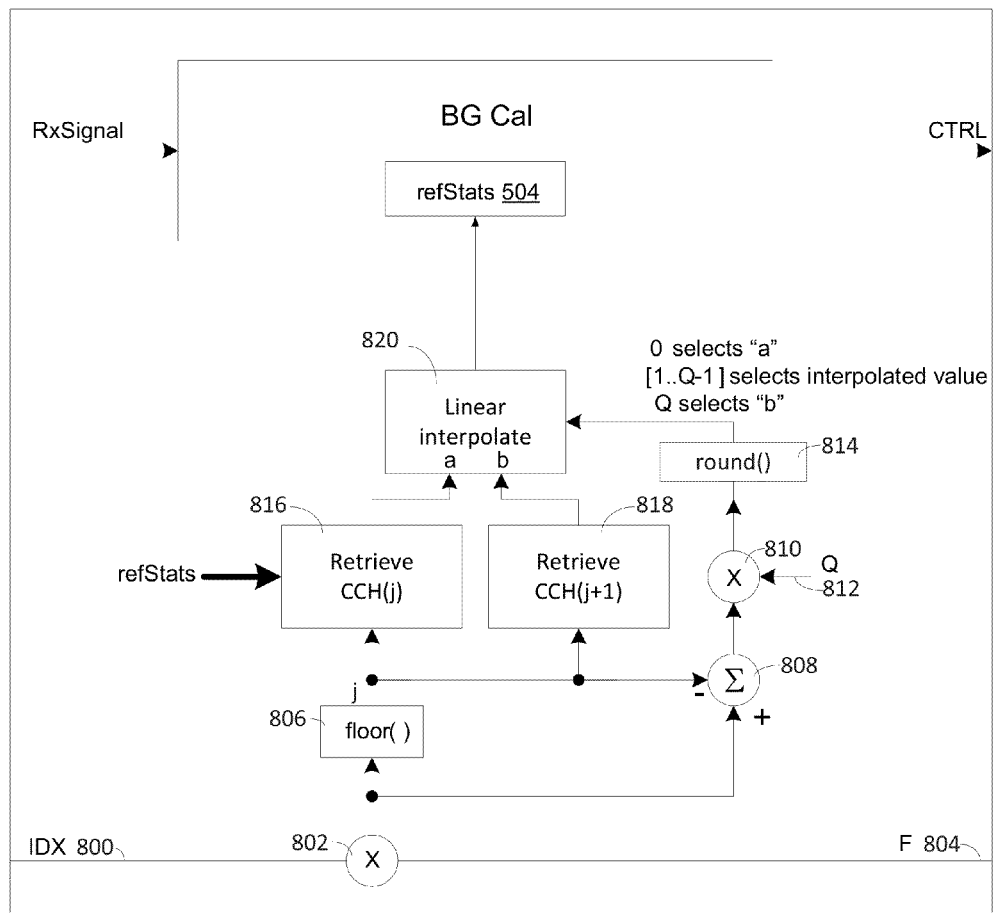
FIG. 18 shows another embodiment of analog to digital calibration circuitry in accordance with the present disclosure.

FIG. 18 shows an implementation of how the reference statistics 504 (FIG. 16) can be adjusted in accordance with the value of "F" provided to the calibration block 190 (FIG. 16). As the reference statistics 504 are adjusted, so is the reference calibration slope. Each ADC index number (IDX) 800 is provided to a multiplier 802 that multiplies the IDX 800 by F 804. The multiplier 802 provides the result of the multiplication to a floor function device 806, which outputs, with respect to the result provided by the multiplier 802, the largest previous integer. This largest previous integer is noted "j". The output of the multiplier 802 is also provided to a summing device 800 that also receives the output of the floor function device 806. The summing device 808 outputs the difference between the output of the multiplier and the output "j" of the floor function device 806. The output of the summing device 808 is provided to a multiplier 810, which also receives, as an input, a number Q 812, which can be a power of two. As will be appreciated by the skilled worker, "0" being a power of two can simplify calculations. The output of the multiplier 810 is provided to a rounding function device 814 and is rounded by the rounding function device 814. The output of the rounding device is provided to an interpolation module 820.

The output "j" of the floor function device 806 is also provided to retrieving devices 816 and 818 that respectively retrieve the value of the CCH for the ADC index values "j" and "j+1". The values of the CCH for the ADC index values "j" and "j+1" can, for the purpose of the present example, be labeled as CCH(j)=a and CCH(j+1)=b. The values "a" and "b" are provided to the interpolation module 820 that interpolates between the values "a" and "b" in accordance with (as a function of) an input received from the rounding function device 814. The output of the interpolation module 820 corresponds to the CCH value at ADC index value obtained by multiplying the IDX 800 with the value F 804.

The output of the rounding function device 814, labeled as output 814, is used by the interpolation module 820 to obtain an interpolated index value=(Q-output814)*a/Q+output814*b/Q.

Alternatively, the multiplier 810 and the rounding function device 814 can be omitted, and the interpolation module 820 can simply receive, directly, the output of the summing device 808 (labeled as output808). This output is added to "a" to obtain the IDX value at which the interpolation module 820 interpolates. In this case, the interpolation index value is calculated as interpolation index value=(1-output808)*a+output808*b. The results obtained by the latter equation can differ slightly from the result obtained by equation index value=(Q-output814)*a/Q+output814*b/Q, which is quicker to calculate, but not as accurate. However, for the purpose of the present disclosure, the accuracy provided by the equation index value=(Q-output814)*a/Q+output814*b/Q can be sufficient.

Figure 19:
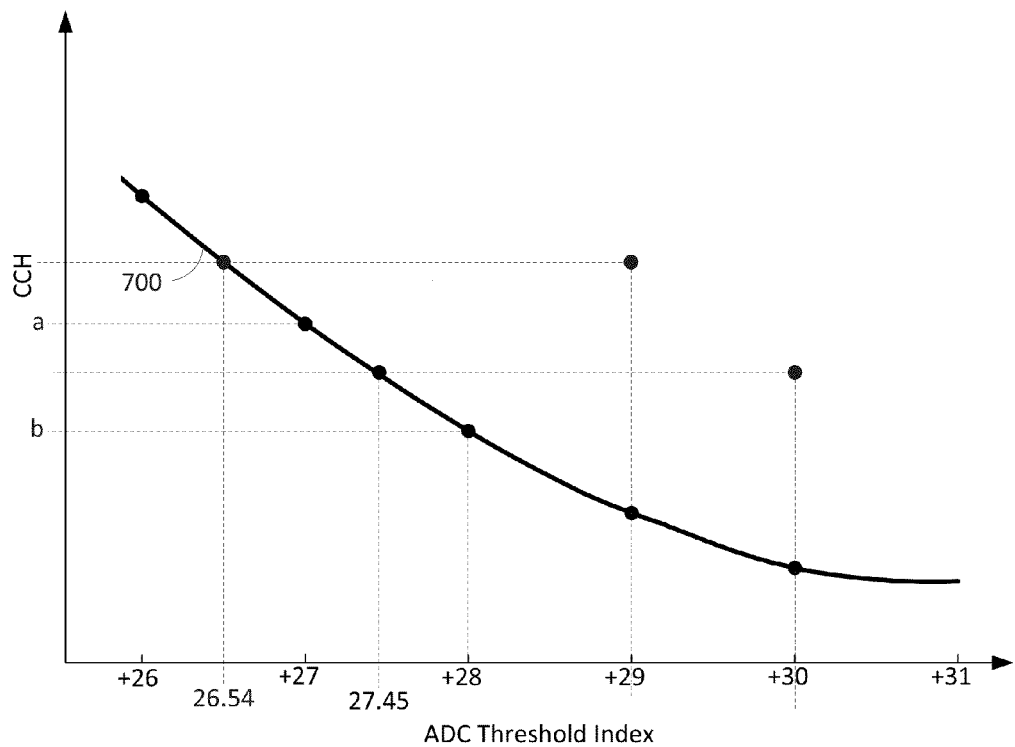
FIG. 19 shows a plot of a complementary cumulative histogram.

FIG. 19 shows a numerical example with the value of IDX 800 being 30 and the value "F" 808 being 0.915. In such a scenario, the product of the IDX by F is equal to 27.45. As such, the CCH value for IDX 800=30 is replaced by the value of the CCH as interpolated between IDX 27 and IDX 28 for the IDX value 27.45. For the value of the IDX 800 being 29 and the value "F" 808 being 0.915, the value of the CCH at the IDX 800 would be replaced to that at IDX 26.54 in the reference CCH 700.

For issues related to practicality of implementation, the reference CCH need not be collected at the desired input signal power level, but at a level that is below the intended input signal power level and represents the lowest intended control setting. The benefit of this approach is that all adjusted CCH statistics will be interpolated from the collected reference statistics and extrapolation of the statistics will not be required. Those knowledgeable in the art will recognize that interpolation is an inherently safer process than extrapolation which is more prone to error.

In some applications, the statistics of the received signal are non-stationary, or at best are "cyclo-stationary, which means that the signal statistics vary in time in a repeating fashion.

In situations where the signal statistics are changing, but in a known manner, it is conceivable to expand the present disclosure to retain information on multiple sets of signal statistics and, based on an external indication, to control the ADC gain intermittently or in an evolutionary fashion. For example, in some embodiments, the protocol layer, which is operationally connected to the physical layer, could indicate to the physical layer that a change in the statistics of the analog signal 102 will occur or has occurred. The protocol layer could signal the physical layer using a logical command through any suitable interface or through direct wire control.

As a simple example of such a situation is when the received signal contains a repeating pattern (as an "idle" pattern or other placeholder) at periodic intervals in time instead of live data. In such cases it can be highly likely that the placeholder signal does not have the same statistics as live data and thus the ADC gain control mechanism should not be executed during this period of time, or it should use a second set of reference statistics to do so.

The following describes an embodiment of the present disclosure within an ADC based receiver that is fully integrated within a CMOS process. As is known in the art, the achievable performance of analog and ADC circuits in a CMOS process continues to improve and fully integrated receivers in CMOS is commonplace. Further, CMOS processes, by nature, provide for a lower power implementation of the digital circuitry. The low power nature of CMOS processes allows for the present disclosure to have little impact on the power efficiency of the ADC conversion process.

Figure 20:
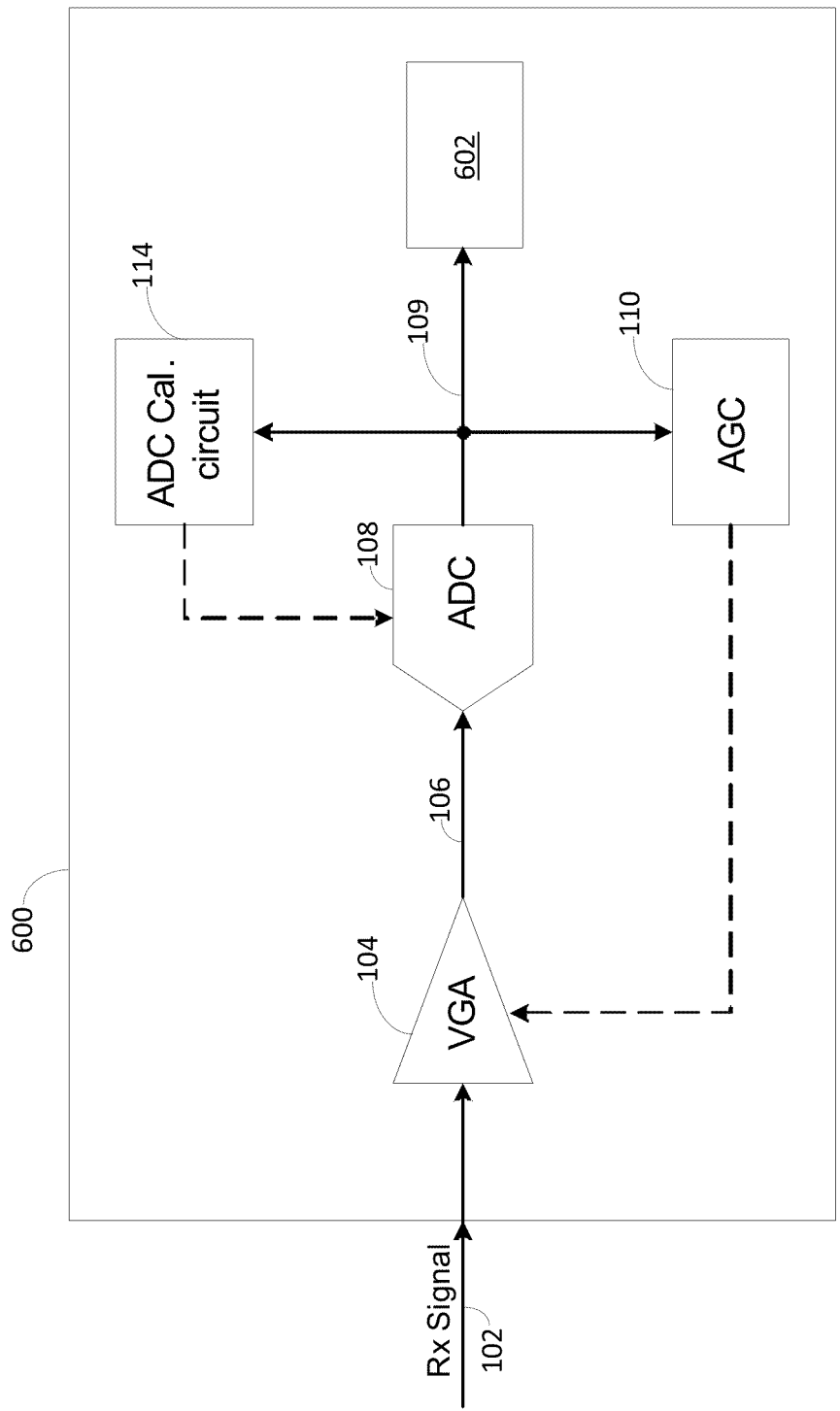
FIG. 20 shows an embodiment of a receiver in accordance with the present disclosure.

An embodiment is depicted in FIG. 20, which shows a CMOS receiver 600. A received signal 102 is applied to a variable gain amplifier 104, which, in some embodiments, could be external to the CMOS receiver 600, or could be fully integrated with the CMOS receiver 600. The gain of the VGA 104 of this circuit is controlled by a digital circuit, the AGC 110 that monitors the digital signal 109. The amplified input signal 106 is sampled using a fully integrated ADC 108 and this data is passed downstream to digital signal analysis and decoding circuitry 602. The output of the ADC 108 is also monitored by the ADC calibration circuit 114. As needed, the digital portion of the ADC 108, the downstream digital signal analysis and decoding circuitry 602, and the gain AGC 110 can be implemented in high-speed/higher-power CMOS structures, or lower-speed/lower-power CMOS structures. The ADC calibration circuit 114, which include ADC Gain Drift Control in accordance with the present disclosure need only be implemented at low speed operation and low power consumption as the drift in the ADC characteristics and the accompanying calibration/compensation will be a very slow process, as might be expected with thermal variations.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

The invention claimed is:

1. A method of controlling an analog to digital converter (ADC), the ADC receiving an input signal, the ADC having a set of threshold levels, the set of threshold levels being controlled by a pre-defined ADC calibration procedure responsive to a level of an input signal provided to the ADC, the method comprising:

a) calculating, as a function of the threshold levels, a metric of the ADC to obtain a calculated metric;

b) comparing the calculated metric with a target metric to obtain a comparison value; and c) adjusting, as a function of the comparison value, the level of the input signal to obtain an adjusted input signal level.

2. The method of claim 1 wherein calculating the metric is preceded by obtaining the threshold levels.

3. The method of claim 1 further comprising, after action b and when there is a previous comparison value, determining if the comparison value is the same as the previous comparison value and, if the comparison value is the same as the previous comparison value, proceeding back to action a, otherwise proceeding to action c.

4. The method of claim 2 wherein:

each threshold level corresponds to a respective voltage level; and calculating the metric includes modeling the threshold levels as a function of one of some of the voltage levels using a linear regression, and all of the voltage levels using the linear regression.

5. The method of claim 4 wherein the linear regression model has a slope associated thereto, the metric of the ADC being the value of the slope.

6. The method of claim 4 wherein:

the target metric is a target slope;

the calculated metric is a calculated slope; and the comparison value is obtained by subtracting the calculated slope from the target slope.

7. The method of claim 6 wherein when the comparison value is positive, adjusting the level of the input signal consists in decreasing the level of the input signal.

8. The method of claim 6 wherein when the comparison value is negative, adjusting the level of the input signal consists in increasing the level of the input signal.

9. A method of controlling a gain of an analog to digital converter (ADC), the ADC receiving an input signal, the ADC having a set of threshold levels, the set of threshold levels being controlled by a pre-defined ADC calibration procedure responsive to a level of an input signal provided to the ADC, the method comprising:

a) calculating, as a function of the threshold levels, a metric of the ADC to obtain a calculated metric;

b) comparing the calculated metric with a target metric to obtain a comparison value, the pre-defined ADC calibration procedure being a function of the target metric; and c) modifying the target metric in accordance with the comparison value to obtain a modified target metric.

10. The method of claim 9 wherein:

the ADC has references statistics associated thereto;

prior to comparing the calculated metric with a target metric to obtain a comparison value, the target metric is determined in accordance with the reference statistics; and modifying the target metric includes modifying the reference statistics.

11. The method of claim 9 wherein:

the reference statistics include a complementary cumulative histogram relating a number of events as a function of a set of ADC threshold indices, each ADC threshold index corresponding to a respective threshold level of the set threshold levels; and modifying the reference statistics includes multiplying the ADC threshold indices by a multiplication factor, the multiplication factor being a function of the comparison value.

12. The method of claim 9 wherein calculating the metric is preceded by obtaining the threshold levels.

13. The method of claim 9 further comprising, after action b, and when there is a previous comparison value, determining if the comparison value is the same as the previous comparison value and, if the comparison value is the same as the previous comparison value, proceeding back to action a, otherwise proceeding to action c.

14. The method of claim 12 wherein:

each threshold level corresponds to a respective voltage level; and calculating the metric includes modeling the threshold levels as a function of one of some of the voltage levels using a linear regression, and all of the voltage levels using the linear regression.

15. The method of claim 14 wherein the linear regression model has a slope associated thereto, the metric of the ADC being the value of the slope.

16. The method of claim 14 wherein:

the target metric is a target slope;

the calculated metric is a calculated slope; and the comparison value is obtained by subtracting the calculated slope from the target slope.

17. The method of claim 10 wherein:

the target metric is a target slope;

the calculated metric is a calculated slope; and the comparison value is obtained by subtracting the calculated slope from the target slope.

18. A non-transitory, tangible computer-readable medium having recorded thereon instructions to be carried out by a processor to perform a method of controlling an analog to digital converter (ADC), the ADC receiving an input signal, the ADC having a set of threshold levels, the set of threshold levels being controlled by a pre-defined ADC calibration procedure responsive to a level of an input signal provided to the ADC, the method comprising:

a) calculating, as a function of the threshold levels, a metric of the ADC to obtain a calculated metric;

b) comparing the calculated metric with a target metric to obtain a comparison value; and c) adjusting, as a function of the comparison value, the level of the input signal to obtain an adjusted input signal level.

19. The non-transitory, tangible computer-readable medium of claim 18 wherein calculating the metric is preceded by obtaining the threshold levels.

20. The non-transitory, tangible computer-readable medium of claim 18 wherein the method further comprises, after action b and when there is a previous comparison value, determining if the comparison value is the same as the previous comparison value and, if the comparison value is the same as the previous comparison value, proceeding back to action a, otherwise proceeding to action c.

21. The non-transitory, tangible computer-readable medium of claim 19 wherein:

each threshold level corresponds to a respective voltage level; and calculating the metric includes modeling the threshold levels as a function of one of some of the voltage levels using a linear regression, and all of the voltage levels using the linear regression.

22. The non-transitory, tangible computer-readable medium of claim 21 wherein the linear regression model has a slope associated thereto, the metric of the ADC being the value of the slope.

23. The non-transitory, tangible computer-readable medium of claim 19 wherein:
the target metric is a target slope;
the calculated metric is a calculated slope; and
the comparison value is obtained by subtracting the calculated slope from the target slope.

24. The non-transitory, tangible computer-readable medium of claim 23 wherein when the comparison value is positive, adjusting the level of the input signal consists in decreasing the level of the input signal.

25. The non-transitory, tangible computer-readable medium of claim 23 wherein when the comparison value is negative, adjusting the level of the input signal consists in increasing the level of the input signal.

26. A non-transitory, tangible computer-readable medium having recorded thereon instructions to be carried out by a processor to perform a method of controlling a gain of an analog to digital converter (ADC), the ADC receiving an input signal, the ADC having a set of threshold levels, the set of threshold levels being controlled by a pre-defined ADC calibration procedure responsive to a level of an input signal provided to the ADC, the method comprising:
a) calculating, as a function of the threshold levels, a metric of the ADC to obtain a calculated metric;
b) comparing the calculated metric with a target metric to obtain a comparison value, the pre-defined ADC calibration procedure being a function of the target metric; and
c) modifying the target metric in accordance with the comparison value to obtain a modified target metric.

27. The non-transitory, tangible computer-readable medium of claim 26 wherein:
the ADC has references statistics associated thereto;
prior to comparing the calculated metric with a target metric to obtain a comparison value, the target metric is determined in accordance with the reference statistics; and
modifying the target metric includes modifying the reference statistics.

28. The non-transitory, tangible computer-readable medium of claim 26 wherein:
the reference statistics include a complementary cumulative histogram relating a number of events as a function of a set of ADC threshold indices, each ADC threshold index corresponding to a respective threshold level of the set threshold levels; and
modifying the reference statistics includes multiplying the ADC threshold indices by a multiplication factor, the multiplication factor being a function of the comparison value.

29. The non-transitory, tangible computer-readable medium of claim 26 wherein calculating the metric is preceded by obtaining the threshold levels.

30. The non-transitory, tangible computer-readable medium of claim 26 wherein the method further comprises, after action b, and when there is a previous comparison value, determining if the comparison value is the same as the previous comparison value and, if the comparison value is the same as the previous comparison value, proceeding back to action a, otherwise proceeding to action c.

31. The non-transitory, tangible computer-readable medium of claim 29 wherein:
each threshold level corresponds to a respective voltage level; and
calculating the metric includes modeling the threshold levels as a function of one of some of the voltage levels using a linear regression, and all of the voltage levels using the linear regression.

32. The non-transitory, tangible computer-readable medium of claim 31 wherein the linear regression model has a slope associated thereto, the metric of the ADC being the value of the slope.

33. The non-transitory, tangible computer-readable medium of claim 31 wherein:
the target metric is a target slope;
the calculated metric is a calculated slope; and
the comparison value is obtained by subtracting the calculated slope from the target slope.

34. The non-transitory, tangible computer-readable medium of claim 27 wherein:
the target metric is a target slope;
the calculated metric is a calculated slope; and
the comparison value is obtained by subtracting the calculated slope from the target slope.

* * * * *

UNITED STATES PATENT AND TRADEMARK OFFICE
CERTIFICATE OF CORRECTION

PATENT NO. : 8,816,886 B1  Page 1 of 1
APPLICATION NO. : 13/833401
DATED : August 26, 2014
INVENTOR(S) : William D. Warner et al.

It is certified that error appears in the above-identified patent and that said Letters Patent is hereby corrected as shown below:

In the Specification

Column 9, line 55, delete "5/20" and insert therefor -- -5/20 --

Signed and Sealed this
Seventeenth Day of March, 2015

Michelle K. Lee
*Director of the United States Patent and Trademark Office*